US012761173B2

(12) United States Patent
Chen

(10) Patent No.: US 12,761,173 B2
(45) Date of Patent: Oct. 13, 2026

(54) SILVER PASTE ACTIVATION DETECTING SYSTEM

(71) Applicant: AAC Optics (Nanning) Co., Ltd., Nanning (CN)

(72) Inventor: Hongbin Chen, Nanning (CN)

(73) Assignee: AAC Optics (Nanning) Co., Ltd., Nanning (CN)

( * ) Notice: Subject to any disclaimer, the term of this patent is extended or adjusted under 35 U.S.C. 154(b) by 130 days.

(21) Appl. No.: 18/988,931

(22) Filed: Dec. 20, 2024

(65) Prior Publication Data

US 2025/0383309 A1 Dec. 18, 2025

Related U.S. Application Data

(63) Continuation of application No. PCT/CN2024/098949, filed on Jun. 13, 2024.

(51) Int. Cl.

| | |
|---|---|
| ***G01N 27/04*** | (2006.01) |
| ***G01N 27/14*** | (2006.01) |
| ***G01N 27/49*** | (2006.01) |
| ***G01R 27/16*** | (2006.01) |
| *H05K 7/20* | (2006.01) |

(52) U.S. Cl.

CPC ......... *G01N 27/041* (2013.01); *G01N 27/045* (2013.01); *G01N 27/14* (2013.01); *G01R 27/16* (2013.01); *H05K 7/20454* (2013.01)

(58) Field of Classification Search

CPC ........ G01N 27/04; G01N 27/14; G01N 27/49; G01R 27/16

See application file for complete search history.

(56) References Cited

U.S. PATENT DOCUMENTS

2020/0273760 A1 * 8/2020 Fukumoto ............ H10P 74/277

* cited by examiner

*Primary Examiner* — Neel D Shah

(74) *Attorney, Agent, or Firm* — Wiersch Law Group

(57) ABSTRACT

Provided is a silver paste activation detecting system, including a power supply module, a test fixture electrically connected to the power supply module and configured to load the module to be tested to form a closed loop, a resistor element connected in series in the closed loop and a test module connected in parallel to the resistor element. The test module detects a voltage value across the resistor element after the conductive silver paste is energized for at least two seconds. When the voltage value is greater than or equal to a predetermined voltage value, the test module determines that the conductive silver paste is activated. When the voltage value is less than the predetermined voltage value, the conductive silver paste is not activated. The system can realize automatic detection of the activation state of the conductive silver paste, thereby greatly saving time and labor costs.

5 Claims, 2 Drawing Sheets

SILVER PASTE ACTIVATION DETECTING SYSTEM

CROSS-REFERENCE TO RELATED APPLICATIONS

This application is a continuation of International Application No. PCT/CN2024/098949, Jun. 13, 2024, the entire contents of which is incorporated herein by reference.

TECHNICAL FIELD

The present application relates to the field of silver paste activation detecting technologies, in particular to a silver paste activation detecting system.

BACKGROUND

As the performance of camera modules in mobile devices improves, the power consumption and heat generation of the camera modules also increase. To reduce the chip temperature of the camera module, heat dissipation can be achieved by copper plating on the chip surface and applying conductive silver paste.

The conductive silver paste needs to be activated through a current applied over a period of time to exhibit its conductive properties. The conventional silver paste activation processes rely on manual activation, requiring workers to actively monitor the current value passing through the silver paste and the duration of the current flow. This type of activation detection consumes a significant amount of time and labor costs.

Therefore, it is necessary to provide a silver paste activation detecting system capable of automatically detecting the activation state of a conductive silver paste.

SUMMARY

The purpose of the present application is to provide a silver paste activation detecting system that can automatically detect the activation state of conductive silver paste.

The technical solution of the application is as follows.

A silver paste activation detecting system for detecting an activation state of a conductive silver paste of a module to be tested, comprising:

- a power supply module configured to output a constant current;
- a test fixture electrically connected to the power supply module and configured to load the module to be tested so as to form a closed loop by connecting in series the power supply module and the conductive silver paste of the module to be tested;
- a resistor element connected in series to the closed loop; and
- a test module connected in parallel to the resistor element;
- wherein the test module is configured to detect a voltage value between two ends of the resistor element after the conductive silver paste is energized for at least two seconds; when the voltage value detected by the test module is greater than or equal to a predetermined voltage value, the test module determines that the conductive silver paste is activated; when the voltage value detected by the test module is less than the predetermined voltage value, the test module determines that the conductive silver paste is not activated.

In one embodiment, the test module comprises an analog-to-digital conversion module connected in parallel to the resistor element and a control module informatively connected to the analog-to-digital conversion module;

- the analog-to-digital conversion module is configured to convert the voltage value between the two ends of the resistor element into a digital signal;
- the control module is configured to obtain the digital signal after the conductive silver paste is energized for at least two seconds, and detect the voltage value between the two ends of the resistor element according to the digital signal; when the voltage value is greater than or equal to the predetermined voltage value, the control module determines that the conductive silver paste is activated; when the voltage value is less than the predetermined voltage value, the control module determines that the conductive silver paste is not activated.

In one embodiment, an output end of the power supply module is connected to an input end of the test fixture; an input end of the resistor element is connected to an output end of the module to be tested, and an output end of the resistor element is connected to an input end of the power module.

In one embodiment, a resistance value of the resistor element is R, a constant current output from the power supply module is I, and the predetermined voltage value is U, wherein $U=I\times R$.

In one embodiment, the constant current output from the power supply module is 100 mA, and the predetermined voltage value is less than 1.5 V.

The beneficial effect of the application is as follows.

A test fixture loaded with a module to be tested, a resistor element, and a power supply module form a closed loop, and the test module is connected in parallel with the resistor element. The test module is capable of detecting the voltage value between two ends of the resistor element, and a conductive silver paste of the module to be tested is connected in series within the closed loop.

The conductive silver paste enters the activation state after passing a current lasting at least two seconds, and the resistance value of the conductive silver paste in the activation state is much smaller than that of the conductive silver paste in the inactivated state. When the current output from the power supply module passes through the conductive silver paste for at least two seconds, the resistance value of the conductive silver paste decreases, and the voltage value between the two ends of the resistor element increases. When the test module detects that the voltage is greater than or equal to the predetermined voltage value, the test module determines that the conductive silver paste is activated, thus realizing automatic detection of the activation state of the conductive silver paste. The automatic detection improves the reliability of the detection of the activation state of the conductive silver paste, which can detect the activation state of the conductive silver paste in bulk, thereby saving a large amount of time and labor costs.

REFERENCE SIGNS

01, module to be tested; 011, PCB board; 012, copper foil; 013, conductive silver paste;

1, power supply module;
2, test fixture; 21, connector;
3, resistor element;
4, test module; 41, analog-to-digital conversion module; and 42, control module.

DETAILED DESCRIPTION OF THE EMBODIMENTS

The present application is further described below in connection with the accompanying drawings and embodiments.

Figure 1:
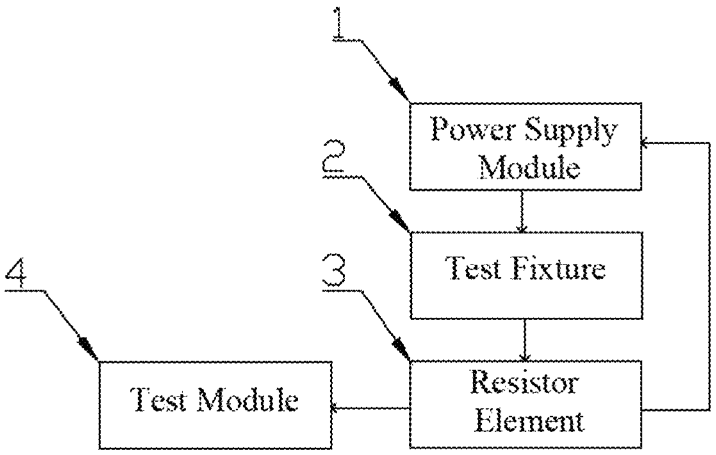
FIG. 1 shows a block diagram of a silver paste activation detecting system according to an embodiment of the present application.
Figure 2:
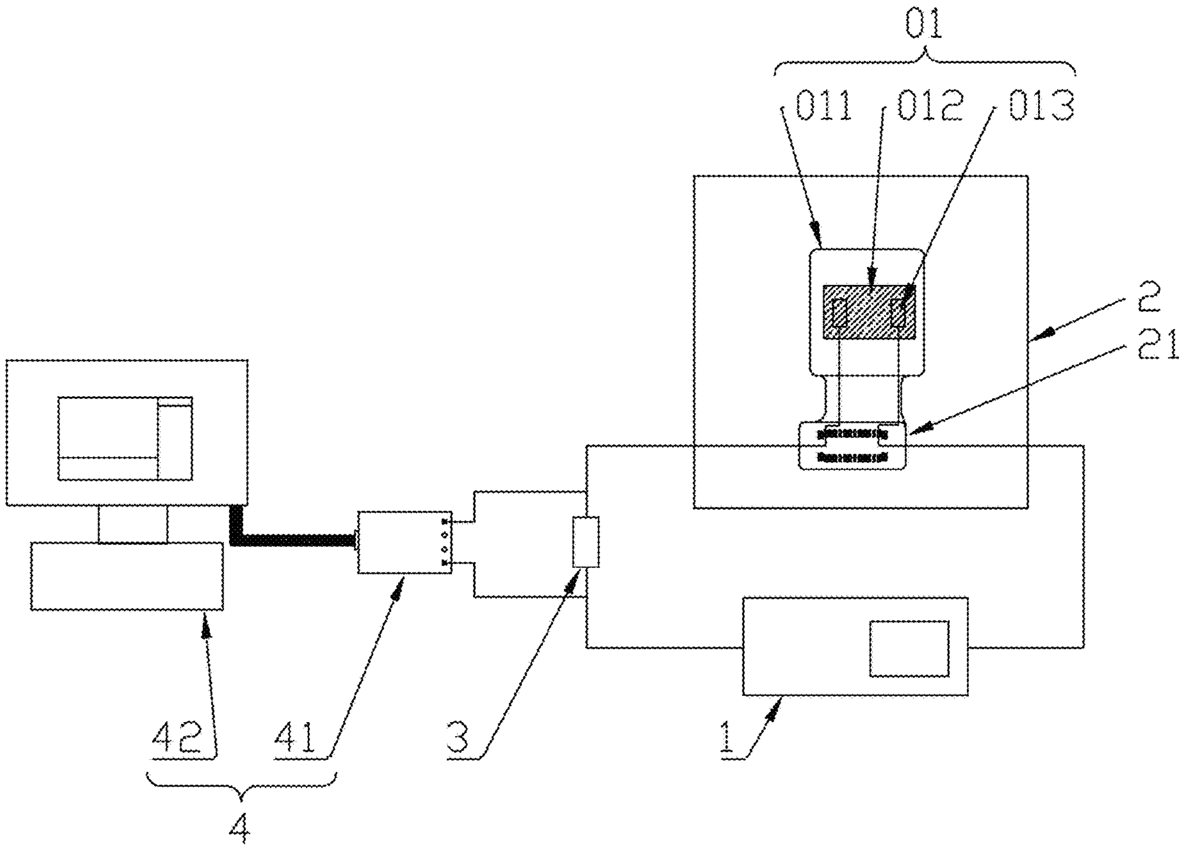
FIG. 2 shows a structural schematic diagram of the silver paste activation detecting system according to an embodiment of the present application.

As shown in FIGS. 1 to 2, provided is a silver paste activation detecting system for detecting an activation state of a conductive silver paste 013 of a module to be tested 01. The system includes a power supply module 1 for outputting a constant current and a test fixture 2 electrically connected to the power supply module 1. The test fixture 2 is configured to load the module to be tested 01 so as to form a closed loop by connecting in series the power supply module 1 and the conductive silver paste 013 of the module to be tested 01.

The system further includes a resistor element 3 connected in series to the closed loop and a test module 4 connected in parallel to the resistor element 3;

The test module 4 is configured to detect a voltage value between two ends of the resistor element 3 after the conductive silver paste 013 is energized for at least two seconds. When the voltage value detected by the test module 4 is greater than or equal to a predetermined voltage value, the test module 4 determines that the conductive silver paste 013 is activated. When the voltage value detected by the test module 4 is less than the predetermined voltage value, the test module 4 determines that the conductive silver paste 013 is not activated.

The test fixture 2 loaded with the module to be tested 01, the resistor element 3, and the power supply module 1 form a closed loop, and the test module 4 is connected in parallel with the resistor element 3. The test module 4 is capable of detecting the voltage value between two ends of the resistor element 3, and the conductive silver paste 013 of the module to be tested 01 is connected in series within the closed loop.

The conductive silver paste 013 enters the activation state after passing a current lasting for at least two seconds. The resistance value of the conductive silver paste 013 in the activation state is much smaller than that of the conductive silver paste 013 in the inactivated state. When the current outputted from the power supply module 1 passes through the conductive silver paste 013 for at least two seconds, the resistance value of the conductive silver paste 013 decreases, and the voltage value between the two ends of the resistor element 3 increases. When the test module 4 detects that the voltage value is greater than or equal to the predetermined voltage value, the test module 4 determines that the conductive silver paste 013 is activated, so as to realize the automatic detection of the activation state of the conductive silver paste 013. The automatic detection improves the reliability of the detection of the activation state of the conductive silver paste 013, which can detect the activation state of the conductive silver paste 013 in bulk, thereby saving a large amount of time and labor costs.

In this embodiment, as shown in FIG. 2, the module to be tested 01 includes a PCB board 011 and a conductive copper foil 012 provided on the surface of the PCB board 011. The conductive silver paste 013 is connected to a welding pad of the PCB board 011 and the conductive copper foil 012. The test fixture 2 can automatically load and unload the module to be tested 01. The test fixture 2 includes a connector 21, and the conductive silver paste 013 is electrically connected to the conductive silver paste 013 through lead wires on the PCB board 011. The conductive silver paste 013 is electrically connected to the connector 21 through the lead wires on the PCB 011, and the connector 21 is connected in series to the closed loop.

It is to be understood that the resistor element 3 may be a single resistor, and the resistor element 3 may also include a plurality of resistors in series, or a plurality of resistors in series and in parallel. In the related art, the conductive silver paste 013 needs to be passed through a constant current of 100 mA for more than two seconds to activate its conductive properties, so the resistance value of the resistor element 3 may be set according to the current output from the power supply module 1.

Further, as shown in FIG. 2, the test module 4 includes an analog-to-digital conversion module 41 connected in parallel to the resistor element 3, and a control module 42 informatively connected to the analog-to-digital conversion module 41.

The analog-to-digital conversion module 41 is configured to convert the voltage value between the two ends of the resistor element 3 into a digital signal.

The control module 42 is configured to obtain the digital signal after the conductive silver paste 013 is energized for at least two seconds, and detect the voltage value between the two ends of the resistor element 3 according to the digital signal. When the voltage value is greater than or equal to the predetermined voltage value, the control module 42 determines that the conductive silver paste 013 is activated. When the voltage value is less than the predetermined voltage value, the control module 42 determines that the conductive silver paste 013 is not activated.

After the power supply module 1 begins to output a constant current in the closed loop, the power supply module 1 and the conductive silver paste 013 of the module to be tested 01 are connected in series to form a closed loop, and the analog-to-digital conversion module 41 detects the voltage value between the two ends of the resistor element 3 and converts it to a digital signal. At this time, the control module 42 is able to obtain the digital signal, and defines the moment at which the power supply module 1 begins to output the constant current in the closed loop as the initial time.

The control module 42 is configured to acquire the digital signal once at the initial time, and the control module 42 is further configured to acquire the digital signal again after an interval of two seconds from the initial time, and to detect the voltage value between the two ends of the resistor element 3 based on the digital signal acquired after the interval of two seconds from the initial time.

In this embodiment, the control module 42 is provided in a computer device, and the analog-to-digital conversion module 41 is connected to the computer device through a data line. The analog-to-digital conversion module 41 and the control module 42 are capable of automatically detecting the voltage value between the two ends of the resistor element 3, and determining the activation state of the conductive silver paste 013 according to the voltage value, thereby realizing automatic detection of the activation of the conductive silver paste 013, and saving time and labor costs.

Further, an output end of the power supply module 1 is connected to an input end of the test fixture 2, an input end of the resistor element 3 is connected to an output end of the test module 01, and an output end of the resistor element 3 is connected to an input end of the power supply module 1.

In this embodiment, as shown in FIG. 2, the current output from the current module passes through the test fixture 2 and the resistor element 3 in turn, and the current output from the current module first passes through the test fixture 2 to activate the conductive silver paste 013 of the module to be tested 01 loaded in the test fixture 2.

Further, the resistance value of the resistor element 3 is R, the constant current output by the power supply module 1 is I, and the predetermined voltage value is U, which satisfies U=I×R.

Further, the constant current output by the power supply module 1 is 100 mA, and the predetermined voltage value is less than 1.5 V.

When the conductive silver paste 013 is activated, the conductive silver paste 013 has a conductive property, and the voltage between the two ends of the module to be tested 01 tends to be 0. The power supply module 1 is a constant current source outputting a constant current of 100 mA, and the constant current output from the power supply module 1 is returned to the power supply module 1 after passing through the conductive silver paste 013 and the resistor element 3. The resistance value of the resistor element 3 is 5Ω, and the voltage between the two ends of the resistor element 3 in this circumstance is calculated as about 500 V according to U=IR. The predetermined voltage value is set to be 500 mV, and when the test module 4 detects that the voltage value between the two ends of the resistor element 3 is greater than or equal to the predetermined voltage value of 500 mV, it is determined that the conductive silver paste 013 is activated.

It can be understood that the resistance value of the resistor element 3 is variable, and the resistance value of the resistor element 3 can be changed. The constant current output from the power supply module 1 is unchanged at 100 mA, and the predetermined voltage value can be changed as long as it is less than 1.5 V.

Compared with the related art, in the above structure, the resistor element 3 is connected in series in the closed circuit formed by the test fixture 2 and the power supply module 1 loaded with the module to be tested 01, and the test module 4 is connected in parallel to the resistor element 3, so that the test module 4 is capable of detecting the voltage value between the two ends of the resistor element 3 and determining the activation state of the conductive silver paste 013 according to the voltage value, which cleverly realizes automatic detection of the activation state of the conductive silver paste 013 without the need for manually determining whether the conductive silver paste 013 meets the activation conditions, thereby greatly saving time and labor costs.

Described above are only embodiments of the present application, and it should be pointed out that, for the ordinary technical personnel in the field, improvements may also be made without departing from the premise of the concept of the present application, but these are all within the protection scope of the present application.

What is claimed is:

1. A silver paste activation detecting system for detecting an activation state of a conductive silver paste of a module to be tested, comprising:

a power supply module configured to output a constant current;

a test fixture electrically connected to the power supply module and configured to load the module to be tested so as to form a closed loop by connecting in series the power supply module and the conductive silver paste of the module to be tested;

a resistor element connected in series to the closed loop; and a test module connected in parallel to the resistor element;

wherein the test module is configured to detect a voltage value between two ends of the resistor element after the conductive silver paste is energized for at least two seconds; when the voltage value detected by the test module is greater than or equal to a predetermined voltage value, the test module determines that the conductive silver paste is activated; when the voltage value detected by the test module is less than the predetermined voltage value, the test module determines that the conductive silver paste is not activated.

2. The system of claim 1, wherein the test module comprises an analog-to-digital conversion module connected in parallel to the resistor element and a control module informatively connected to the analog-to-digital conversion module;

the analog-to-digital conversion module is configured to convert the voltage value between the two ends of the resistor element into a digital signal;

the control module is configured to obtain the digital signal after the conductive silver paste is energized for at least two seconds, and detect the voltage value between the two ends of the resistor element according to the digital signal; when the voltage value is greater than or equal to the predetermined voltage value, the control module determines that the conductive silver paste is activated; when the voltage value is less than the predetermined voltage value, the control module determines that the conductive silver paste is not activated.

3. The system of claim 1, wherein an output end of the power supply module is connected to an input end of the test fixture; an input end of the resistor element is connected to an output end of the module to be tested, and an output end of the resistor element is connected to an input end of the power module.

4. The system of claim 1, wherein a resistance value of the resistor element is R, a constant current output from the power supply module is I, and the predetermined voltage value is U, wherein U=I×R.

5. The system of claim 4, wherein the constant current output from the power supply module is 100 mA, and the predetermined voltage value is less than 1.5 V.

* * * * *